(12) United States Patent
Lannetoft

(10) Patent No.: US 12,381,389 B2
(45) Date of Patent: Aug. 5, 2025

(54) METHOD FOR CONTROLLING STRAY CURRENTS IN A MARINE ELECTRICAL SUPPLY SYSTEM AND A MARINE VESSEL COMPRISING A MARINE ELECTRICAL SUPPLY SYSTEM

(71) Applicant: VOLVO PENTA CORPORATION, Gothenburg (SE)

(72) Inventor: Simon Lannetoft, Trollhättan (SE)

(73) Assignee: VOLVO PENTA CORPORATION, Gothenburg (SE)

( * ) Notice: Subject to any disclaimer, the term of this patent is extended or adjusted under 35 U.S.C. 154(b) by 30 days.

(21) Appl. No.: 18/342,883

(22) Filed: Jun. 28, 2023

(65) Prior Publication Data
US 2024/0014650 A1    Jan. 11, 2024

(30) Foreign Application Priority Data

Jul. 5, 2022  (EP) .................................. 22183159

(51) Int. Cl.
| | | |
|---|---|---|
| *B63B 79/10* | (2020.01) | |
| *B63B 79/40* | (2020.01) | |
| *G01R 31/52* | (2020.01) | |
| *H02J 3/00* | (2006.01) | |

(52) U.S. Cl.
CPC ............ *H02J 3/0012* (2020.01); *B63B 79/10* (2020.01); *B63B 79/40* (2020.01); *G01R 31/52* (2020.01)

(58) Field of Classification Search
CPC ........ H02J 3/0012; H02J 4/00; H02J 2310/42; B63B 79/10; B63B 79/40; G01R 31/52; H02H 3/16; H02H 9/02; H02H 9/08; C23F 13/04; C23F 2213/11; C23F 2213/31; B63J 2003/043
See application file for complete search history.

(56) References Cited

U.S. PATENT DOCUMENTS

| | | | |
|---|---|---|---|
| 2009/0160427 A1* | 6/2009 | Drake .............. | G01R 19/16566 324/72 |
| 2014/0210411 A1* | 7/2014 | Fluxa ........................ | H02J 3/02 320/109 |
| 2020/0036180 A1 | 1/2020 | Spesser et al. | |

OTHER PUBLICATIONS

Extended European Search Report in corresponding European Application No. 22183159.7 dated Jan. 3, 2023 (8 pages).

* cited by examiner

*Primary Examiner* — Elim Ortiz
(74) *Attorney, Agent, or Firm* — Venable LLP; Jeffri A. Kaminski

(57) ABSTRACT

A method and a system for cancelling stray currents in a marine electrical supply system, which system comprises a protective earth circuit connecting a vessel to ground when a source of power is connected to the vessel is described. The method involves the steps of monitoring the current in the protective earth circuit using a current sensor; determining if a stray current is detected by the current sensor, and, if a stray current is detected, counteracting the stray current in the protective earth circuit to reduce the stray current to a value at or near zero current.

11 Claims, 5 Drawing Sheets

METHOD FOR CONTROLLING STRAY CURRENTS IN A MARINE ELECTRICAL SUPPLY SYSTEM AND A MARINE VESSEL COMPRISING A MARINE ELECTRICAL SUPPLY SYSTEM

TECHNICAL FIELD

The present invention relates to a method for controlling stray currents in a marine electrical supply system in order to prevent degradation of both metallic components and sacrificial elements on board a vessel connected to a source of shore power supplying either alternating current (AC) or direct current (DC). When connected to shore power, stray currents from outside source can flows through wiring, vessel, surrounding water to ground, which stray currents contribute to severe electrolytic corrosion, or externally induced galvanic action on the vessel.

BACKGROUND

It is normal practice to provide shore power for vessels at shore facilities such as marinas, which power sources commonly comprise either a DC system or a 3-/4-wire AC system for various electrical devices onboard the vessel. The electrical devices can include one or more battery chargers, depending on the number and type of batteries, bilge pumps, air-condition units, lights and other auxiliary devices requiring electrical power.

It is also common practice to provide protection for the hull, conductive fittings, paint, and other conductors in and on the vessel against corrosion, commonly called DC galvanic corrosion, which arises when a metal hull or other metallic components and a dissimilar metal, for instance the propellers, are both placed in the same aqueous solution, particularly in seawater. Examples of corrosion protection can comprise impressed current corrosion protection (ICCP) systems and/or passive sacrificial anodes.

The occurrence of stray currents in AC and DC shore power or vessel systems can have different causes. For instance, the AC power source at the marina may not be properly wired and may have power, neutral, and safety ground lines interchanged (commonly called reversed polarity). Alternatively, the AC system onboard the vessel is not properly wired, or has AC leakage to the vessel ground. These problems can cause leakage or fault AC currents and cause serious harm or failure to underwater parts and electrical devices onboard the vessel.

The DC systems provided to overcome the galvanic action provided on the vessel are frequently interconnected with the safety ground. Leakage currents through this path can result in accelerated corrosion. AC voltage on the safety ground represents a serious electrolysis and safety problem for all vessels and marina apparatus.

This stray current causes all underwater corrosion protective active elements (typically zinc's) and the more noble underwater metallic parts (e.g. bronze propellers) of the vessel with a DC ground connected to the AC safety ground wiring to be electrically connected. The result is a very large area electrolytic corrosion network, which may rapidly deplete the more active elements on the vessel. This can be made worse by the combined effect of galvanic corrosion if multiple vessels are connected to the same shore facility.

Another form of damage is electrolytic corrosion caused by introducing shore AC electrical power commonly connected into the DC ground systems of vessels. This corrosion arises due to improper wiring, leakage, and AC return line voltage drop that is inducing low levels of AC voltage into the common AC shore power safety ground. This can result in depletion of both the active elements, and the more noble underwater elements of a vessel. This type of damage attacks all through-hull fittings, corroding and eventually destroying them, so that the vessel can be subjected to flooding due to failure of the through-hull fittings.

A further failure mechanism is electrical damage that develops as a result of stray current unbalance in shore electric power delivered to the vessel. This happens when current is being supplied to the vessel, but not returning through the intended return line. The unbalanced current can be leaking off through the water into the marina, or through the AC safety ground. This type of failure in an otherwise properly wired vessel may be caused by movement of electrical contacts touching each other in an electrical distribution panel, or by ingress of seawater into a circuit that is intended to be insulated, but which circuit instead leaks off to ground through the wet area. Some electrical systems, like refrigerators, heaters, air-conditioners, or timer run devices may have faults that do not activate until switched on unexpectedly, long after the operators have departed the vessel.

The invention provides an improved method for controlling stray currents in a marine electrical supply system aiming to solve the above-mentioned problems.

SUMMARY

An object of the invention is to provide a method for controlling stray currents in a marine electrical supply system, a marine electrical supply system comprising a protective earth circuit operable using this method and a vessel comprising such a marine electrical supply system.

The object is achieved by a method for controlling stray currents, a marine electrical supply system comprising a protective earth circuit operable using the method and a marine vessel comprising such a protective earth circuit according to the appended claims.

In the subsequent text, the marine electrical supply system can comprise a shore based source of direct current (DC) electrical power or a source of alternating current (AC) electrical power connectable to a vessel or a floating marine structure. In the case of a source of AC power the vessel or floating structure can be provided with an AC/DC rectifier. The invention is primarily described for application to a marine vessel, although it is applicable to both marine vessels and floating marine structures with an electrical supply system provided with a protective earth circuit, also termed a PE circuit.

According to one aspect of the invention, the invention relates to a method for cancelling stray currents in a marine electrical supply system, which system comprises a protective earth (PE) circuit connecting a vessel to ground when a source of power is connected to the vessel. The method involves the steps of:
 monitoring the current in the protective earth circuit using a current sensor;
 determining if a stray current is detected by the current sensor, and
 if a stray current is detected
 counteracting the stray current in the protective earth circuit to reduce the stray current to a value at or near zero current.

The stray current in the protective earth circuit can be counteracted if the stray current detected by the current sensor is above a threshold value. The threshold value can be set to zero for continuous control. Alternatively it can be set to a few milliamperes (mA) so that the supply system does not initiate control in response to minimal random variations in stray current.

The current monitoring is performed using a suitable current sensor such as an inductive current sensor arranged in the PE circuit. According to a first example, the inductive current sensor is a current transformer. According to a second example, the inductive current sensor is a Hall Effect sensor. According to a third example, the inductive current sensor is a fluxgate sensor.

The method involves counteracting the stray current in the protective earth circuit in order to reduce the stray current to zero, or at least to a value below the threshold value. A detected stray current in the protective earth circuit is counteracted by inducing a counter-current into the protective earth circuit using a suitable means such as protected earth line PE.

According to a second aspect of the invention, the invention relates to a marine electrical supply system to connect a marine vessel to a source of shore power, wherein the electrical supply system has a protective earth circuit (PE). The PE circuit comprises a first positive earth connection extending from the shore power source to a vessel connector, a second positive earth connection extending from the vessel connector to a ground bus bar, and a third positive earth connection extending from the ground bus bar to one or more vessel loads.

The second positive earth connection comprises a current sensor arranged to detect a stray current in the protective earth circuit (PE) and to emit a signal proportional to the detected current, a control unit arranged to receive the emitted signal and to generate and transmit a control signal, and a means for counteracting the stray current in the protective earth circuit in response to the transmitted control signal, whereby the means is operated to reduce the stray current to a value at or near zero current.

The means for counteracting the stray current in the protective earth circuit is arranged to be operated if the detected stray current is above a threshold value. The threshold value can be set to zero for continuous control. Alternatively it can be set to a few milliamperes (mA) so that the supply system does not initiate control in response to minimal random variations in stray current.

The current monitoring is performed using a suitable current sensor such as an inductive current sensor arranged in the PE circuit. According to a first example, the inductive current sensor is a current transformer. According to a second example, the inductive current sensor is a Hall Effect sensor. According to a third example, the inductive current sensor is a fluxgate sensor.

The means for counteracting the stray current in the protective earth circuit is operated to reduce the stray current to zero, or at least to a value below the threshold value. A detected stray current in the protective earth circuit is counteracted by inducing a counter-current into the protective earth circuit using a suitable means such as a controllable induction coil.

According to a third aspect of the invention, the invention relates to a marine vessel or floating structure comprising a marine electrical supply system as described in any one of the above examples.

The method and system according to the invention provides a means for counteracting stray current in the protective earth circuit to reduce the stray current. This solves the problem of damage from electrolytic corrosion caused by introducing shore AC electrical power commonly connected into the DC ground systems of vessels. A further problem solved by the invention is the risk of electrical damage that develops as a result of stray current unbalance in shore electric power delivered to the vessel. It is also possible to avoid the combined effect of galvanic corrosion if multiple marine vessels are connected to the same shore facility.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples. In the drawings.

DETAILED DESCRIPTION OF EXAMPLE EMBODIMENTS OF THE INVENTION

Figure 1:
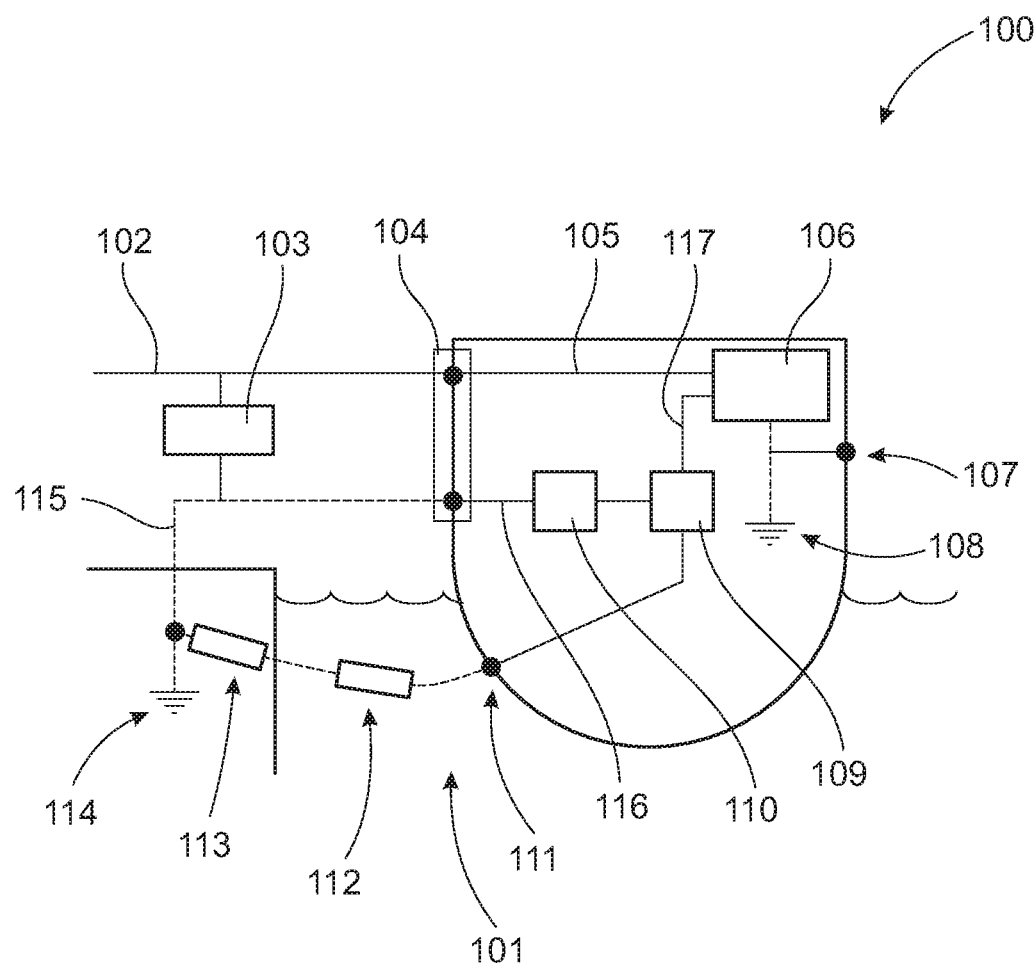
FIG. 1 shows a schematically illustrated vessel connected to DC shore power.

FIG. 1 shows a schematically illustrated vessel 100 connected to DC shore power 102. The figure shows a marine electrical supply system, which system comprises a grounded line 115 connecting the vessel 100 to ground 114 when the source of power 102 is connected to the vessel 100. The supply system comprises said source of power 102 which is connected to a vessel connector 104. The electrical supply system of the vessel is releasably connected to the source of power 102 by means of vessel connector 104, which can be a standard plug-and-socket arrangement. The source of power 102 is schematically indicated as a single power line (see FIG. 3) from the grid or a shore energy storage facility. The vessel connector 104 is connected to one or more vessel loads, indicated as a general vessel load 106, via a power line 105. The vessel load 106 is in turn grounded to the vessel hull at a point 107 and/or to ground 108 on board the vessel.

The electrical supply system is further connected to onshore ground 114 via a grounded line 115 which is connected to the vessel connector 104. An Insulation Monitoring Device (IMD) 103 is connected between the source of power 102 and the grounded line 115. The IMD 103 is arranged for measuring the insulation resistance of the power supply system and monitors it against earth. On-board the vessel 100, a first grounded line 116 connects the vessel connector 104 to a device 110 for controlling stray current, which in turn is connected to a vessel busbar 109 via a connecting grounded line. In the field of electric power distribution, a busbar (also "bus bar") is a metallic strip or bar, typically housed inside switchgear, panel boards and busway enclosures for local high current power distribution. They can also be used to connect high voltage equipment at electrical switchyards, and low voltage equipment in battery banks. The vessel busbar 109 is connected to the vessel load 106 via a second grounded line 117 and is grounded to the vessel hull at a point 111. The vessel hull is conductively connected to onshore ground via the surrounding seawater acting as an electrolyte and forming a return connection. The resistivity of the seawater is schematically indicated by a first resistor 112. Similarly, the resistivity of the ground between the electrolyte and the onshore ground 114 for the electrical supply 102 is schematically indicated by a second resistor 113. This arrangement creates a protected earth (PE) circuit 101 comprising the onshore ground 114,
the grounded line 115 connected to the vessel connector 104,
the first grounded line 116 connecting the vessel connector 104 and the device 110 for controlling stray current,
the vessel busbar 109 connected between the device 110 for controlling stray current and the hull ground connection point 111; and
the return connection through the seawater back to the onshore ground.

In operation, the device 110 for controlling stray current is arranged to monitor the current in the protective earth circuit 101 using a current sensor and to determine if a stray current is detected by the current sensor. If a stray current is detected the device 110 is arranged to counteract the stray current in the protective earth circuit 101 to reduce the stray current to a value at or near zero current. This operation will be described in further detail in connection with FIG. 3 below.

Figure 2:
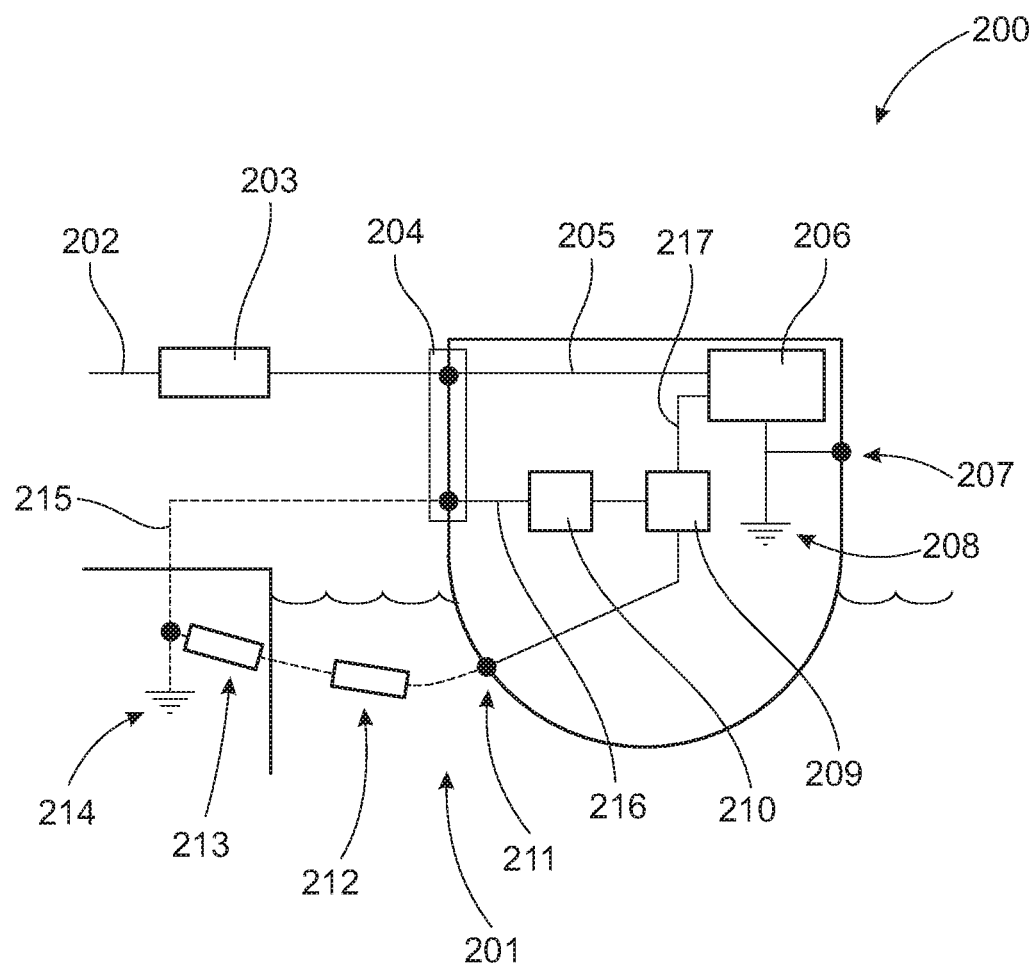
FIG. 2 shows a schematically illustrated vessel connected to AC shore power.

FIG. 2 shows a schematically illustrated vessel 200 connected to AC shore power 202. The figure shows a marine electrical supply system, which system comprises a grounded line 215 connecting the vessel 200 to ground 214 when the source of power 202 is connected to the vessel 200. The supply system comprises said source of power 202 which is connected to a vessel connector 204. The electrical supply system of the vessel is releasably connected to the source of power 202 by means of vessel connector 204, which can be a standard plug-and-socket arrangement. The source of power 202 is schematically indicated as a single power line (see FIG. 4) from the grid or a portable AC energy supply facility. The vessel connector 204 is connected to one or more vessel loads, indicated as a general vessel load 206, via a power line 205. The vessel load 206 is in turn grounded to the vessel hull at a point 207 and/or to ground 208 on board the vessel.

The electrical supply system is further connected to the vessel connector 204 via a Residual-Current Device (RCD) 203. The RCD 203 is an electrical safety device that quickly breaks an electrical circuit with leakage current to ground. On board the vessel 200, a first grounded line 216 connects the vessel connector 204 to a device 210 for controlling stray current, which in turn is connected to a vessel busbar 209 via a connecting grounded line. The vessel busbar 209 is connected to the vessel load 206 via a second grounded line 217 and is grounded to the vessel hull at a point 211. The vessel hull is conductively connected to onshore ground via the surrounding seawater acting as an electrolyte and forming a return connection. The resistivity of the seawater is schematically indicated by a first resistor 212. Similarly, the resistivity of the ground between the electrolyte and the onshore ground 214 for the electrical supply 202 is schematically indicated by a second resistor 213. This arrangement creates a protected earth (PE) circuit comprising the onshore ground 214,
the grounded line 215 connected to the vessel connector 204,
the first grounded line 216 connecting the vessel connector 204 and the device 210 for controlling stray current,
the vessel busbar 209 connected between the device 210 for controlling stray current and the hull ground connection point 211; and
the return connection through the seawater back to the onshore ground.

In operation, device 210 for controlling stray current is arranged to monitor the current in the protective earth circuit 201 using a current sensor and to determine if a stray current is detected by the current sensor. If a stray current is detected the device 210 is arranged to counteract the stray current in the protective earth circuit 201 to reduce the stray current to a value at or near zero current. This operation will be described in further detail in connection with FIG. 4 below.

Figure 3:
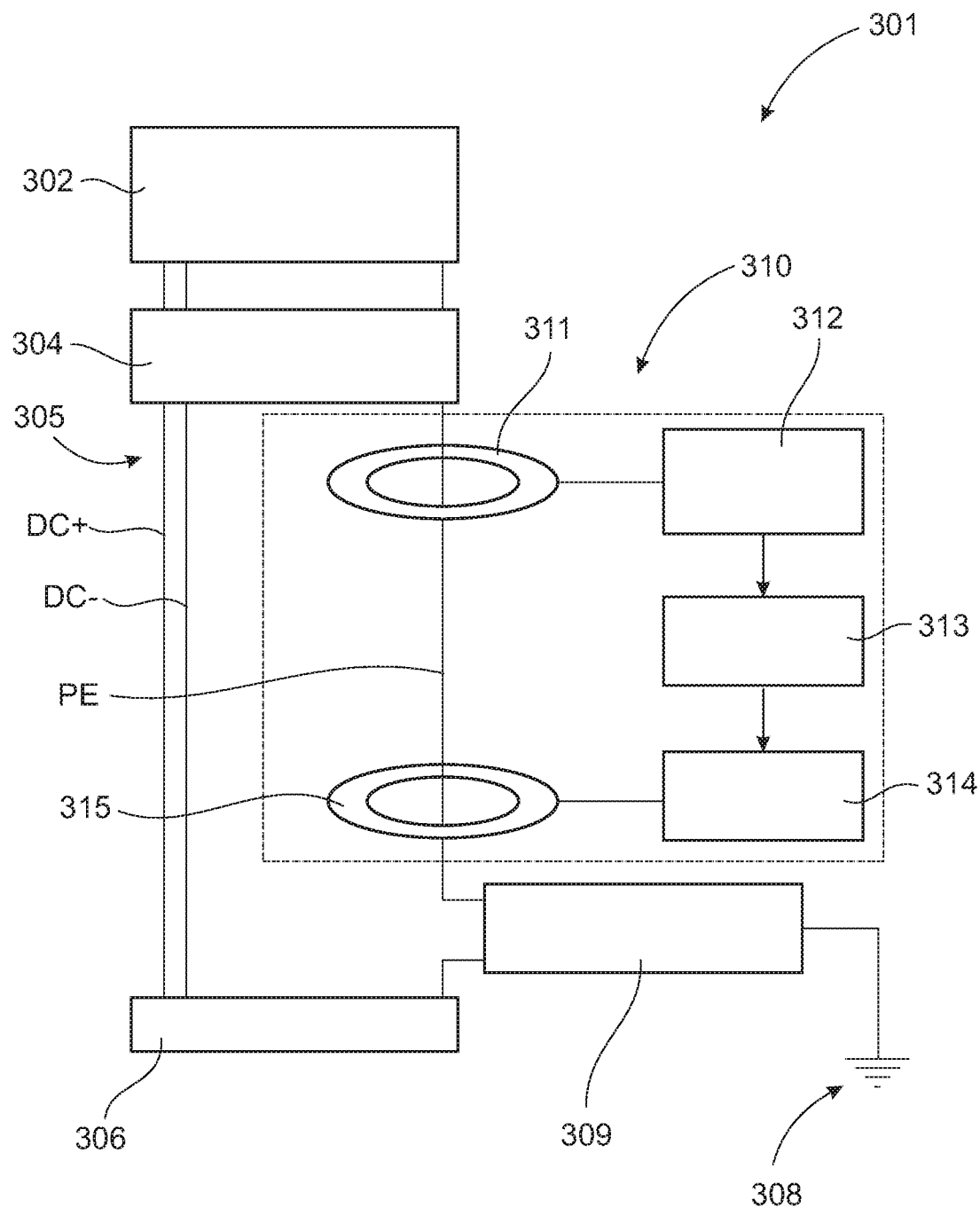
FIG. 3 shows a schematic vessel electrical system connected to DC shore power.

FIG. 3 shows a schematic vessel electrical system 301 connected to a source of DC shore power 302. The vessel is releasably connected to the shore power 302 via a vessel connector 304. The shore power 302 also comprises a connection to ground (not shown; see FIG. 1; "114"). On board the vessel, the vessel connector 304 is connected to a general vessel load 306 via a power line 305 comprising a positive DC+ conductor and a negative DC− conductor. The vessel connector 304 is further connected to a vessel busbar 309 via a protected earth line PE which passes through a device 310 for controlling stray current in the protected earth line PE. The vessel busbar 309 is in turn connected to the vessel load 306 and to ground 308. The connection to ground 308 connects the busbar to the vessel hull. As the shore power 302 and the vessel busbar 309 are both connected to ground, a protective earth circuit (see FIG. 1; "101") is created, which runs from onshore ground, through a grounded line in the vessel connector 304, through the busbar 309 and back through the vessel hull and the surrounding seawater.

As described above, the device 310 for controlling stray current in the protected earth line PE is connected between the vessel connector 304 and the busbar 309. The device 310 comprises an inductive current sensor 311 which in this case is a current transformer inductively connected to the protected earth line PE and having a sensor for measuring current. The current sensor 311 transmits a signal representing the magnitude of the stray current in the protected earth line PE to a current monitor 312. The current monitor 312 transmits the signal to a control circuit 313, which outputs a control signal to a current inductor 314. The control circuit 313 can compare the input signal from the current monitor 312 with a threshold value. The control signal is regulated depending on the magnitude and direction of the detected stray current. The control signal is received by a current inductor 314 which is arranged to output a current to a controllable induction coil 315 in response to the control signal. As the induction coil 315 induces a counter-current into the protected earth line PE the stray current detected by the current sensor 311 is reduced. In this way the device 310 is arranged to counteract stray current detected in the protective earth circuit in order to reduce the stray current to a value at or near zero current.

Figure 4:
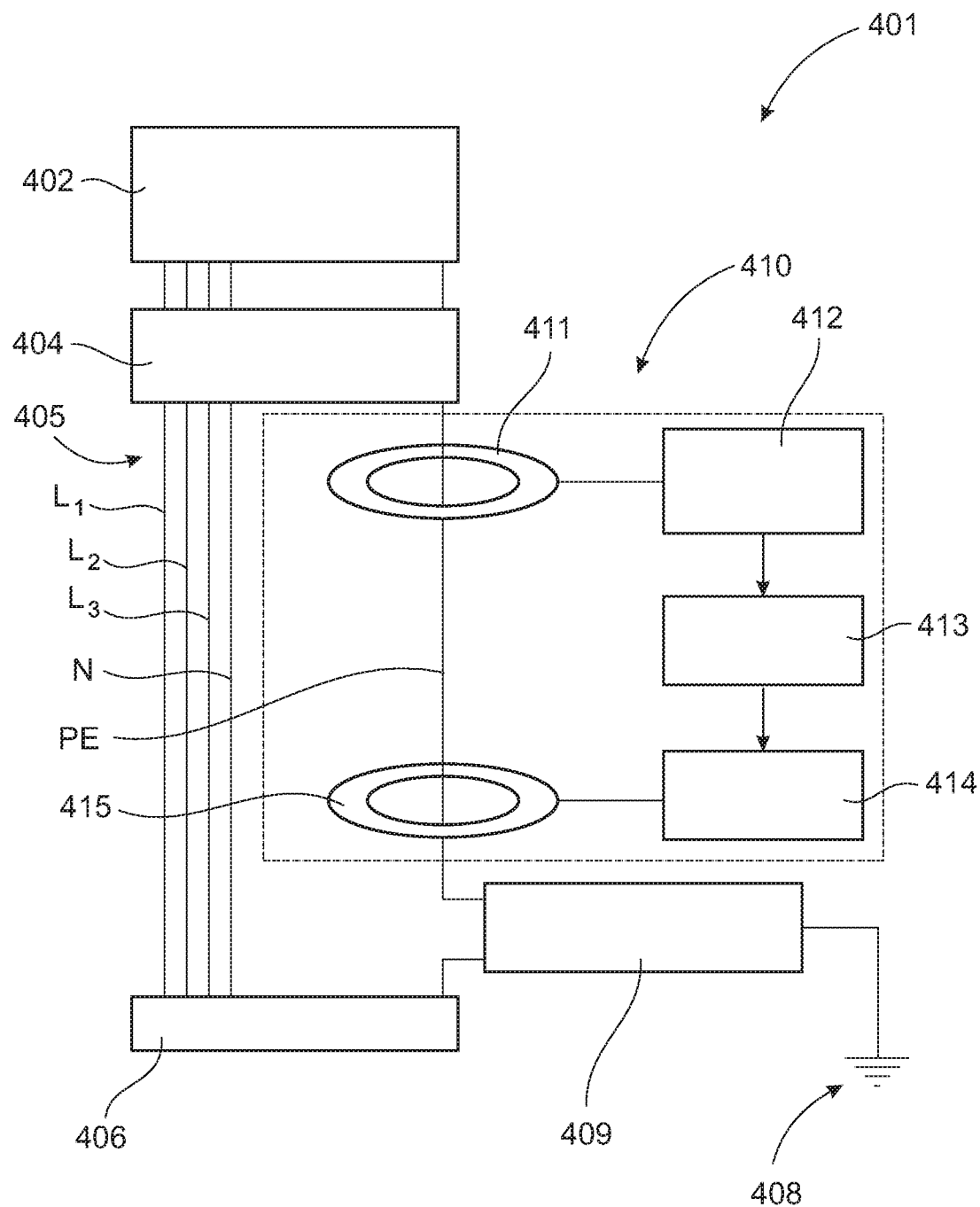
FIG. 4 shows a schematic vessel electrical system connected to AC shore power.

FIG. 4 shows a schematic vessel electrical system 401 connected to AC shore power 402. The vessel is releasably connected to the shore power 402 via a vessel connector 404. The shore power 402 also comprises a connection to ground (not shown; see FIG. 2; "214"). On board the vessel, the vessel connector 404 is connected to a general vessel load 406 via a power line 405 comprising a first, second and third conductor $L_1$, $L_2$, $L_3$ and a neutral conductor N. The vessel connector 404 is further connected to a vessel busbar 409 via a protected earth line PE which passes through a device 410 for controlling stray current in the protected earth line PE. The vessel busbar 409 is in turn connected to the vessel load 406 and to ground 408. The connection to ground 408 connects the busbar to the vessel hull. As the shore power 402 and the vessel busbar 409 are both connected to ground, a protective earth circuit (see FIG. 2; "201") is created, which runs from onshore ground, through a grounded line in the vessel connector 404, through the busbar 409 and back through the vessel hull and the surrounding seawater.

As described above, the device 410 for controlling stray current in the protected earth line PE is connected between the vessel connector 404 and the busbar 409. The device 410 comprises an inductive current sensor 411 which in this case is a current transformer inductively connected to the protected earth line PE and having a sensor for measuring current. The current sensor 411 transmits a signal representing the magnitude of the stray current in the protected earth line PE to a current monitor 412. The current monitor 412 transmits the signal to a control circuit 413, which outputs a control signal to a current inductor 414. The control circuit 413 can compare the input signal from the current monitor 412 with a threshold value. The control signal is regulated depending on the magnitude and direction of the detected stray current. The control signal is received by a current inductor 414 which is arranged to output a current to a controllable induction coil 415 in response to the control signal. As the induction coil 415 induces a counter-current into the protected earth line PE the stray current detected by the current sensor 411 is reduced. In this way the device 410 is arranged to counteract stray current detected in the protective earth circuit in order to reduce the stray current to a value at or near zero current.

Figure 5:
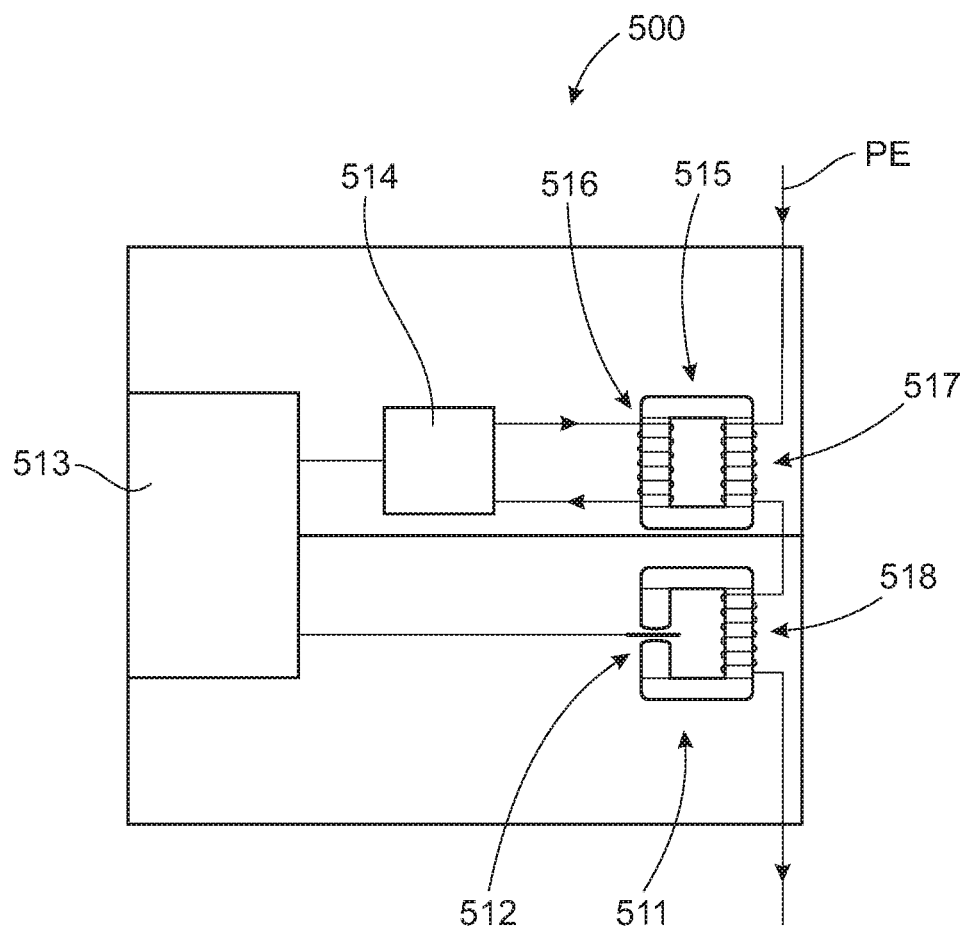
FIG. 5 shows a schematically arrangement for counteracting stray currents.

FIG. 5 shows a schematically arrangement for counteracting stray currents. The arrangement comprises a device 500 for controlling stray current in a protected earth line PE which is connected between a vessel connector (see FIG. 3, "304"; FIG. 4, "404") and a busbar (see FIG. 3, "404"; FIG. 4, "409"). The device 500 comprises an inductive current sensor which in this case is an inductive current transformer 511 inductively connected to the protected earth line PE and having a sensor 512 for measuring current. The current sensor 512 transmits an input signal representing the magnitude of the stray current in the protected earth line PE to a current monitoring control unit 513, which outputs a control signal to a current inductor 514 that control a current inductive coil 516 in a current transformer 515. The control unit 513 can compare the magnitude of the input signal from the current sensor 512 with a threshold value. When the threshold is exceeded then the control signal is regulated depending on the magnitude and direction of the detected stray current. If a threshold is not used, then the control signal is regulated immediately depending on the magnitude and direction of the detected stray current. The control signal from the control unit 513 is received by a current inductor 514 which is arranged to output a current to the controllable induction coil 516 in the current transformer 515 in response to the control signal. As the induction coil 516 induces a counter-current into the protected earth line PE the stray current detected by the current sensor 512 is reduced. In this way the device 500 is arranged to counteract stray current detected in the protective earth circuit in order to reduce the stray current to a value at or near zero current.

It is to be understood that the present invention is not limited to the embodiments described above and illustrated in the drawings; rather, the skilled person will recognize that many changes and modifications may be made within the scope of the appended claims.

The invention claimed is:

1. A method for cancelling stray currents in a marine electrical supply system, which system comprises a protective earth circuit connecting a vessel to ground when a source of power is connected to the vessel, wherein the method involves the steps of:
   monitoring the current in the protective earth circuit using a current sensor;
   determining when a stray current is detected by the current sensor, and when a stray current is detected, counteracting the stray current in the protective earth circuit by arranging a controllable induction coil to induce a counter-current into the protected earth circuit to reduce the stray current to a value at or near zero current.

2. The method according to claim 1, wherein the stray current in the protective earth circuit is counteracted when the detected stray current is above a threshold value.

3. The method according to claim 2, wherein the stray current in the protective earth circuit is counteracted to reduce the stray current to a value below the threshold value.

4. The method according to claim 1, wherein the current monitoring is performed using an inductive current sensor.

5. The method according to claim 4, wherein the inductive current sensor is a current transformer, a Hall Effect sensor or a fluxgate sensor.

6. A marine electrical supply system to connect a marine vessel to a source of shore power, wherein the electrical supply system has a protective earth circuit comprising
   a first positive earth connection extending from the shore power source to a vessel connector;
   a second positive earth connection extending from the vessel connector to a ground bus bar; and
   a third positive earth connection extending from the ground bus bar to one or more vessel loads;
   wherein the second positive earth connection comprises
   a current sensor arranged to detect a stray current in the protective earth circuit and to emit a signal proportional to the detected current;
   a control unit arranged to receive the emitted signal and to generate and transmit a control signal; and
   a controllable induction coil for counteracting the stray current in the protective earth circuit in response to the transmitted control signal, whereby the controllable induction coil is configured to induce a counter-current into the protected earth circuit to reduce the stray current to a value at or near zero current.

7. The marine electrical supply system according to claim 6, wherein the means for counteracting the stray current in the protective earth circuit is configured to be regulated when the detected stray current is above a threshold value.

8. The marine electrical supply system according to claim 7, wherein the means for counteracting the stray current in the protective earth circuit is configured to be regulated to reduce the stray current to a value below the threshold value.

9. The marine electrical supply system according to claim 6, wherein the current sensor is an inductive current sensor.

10. The marine electrical supply system according to claim 9, wherein the inductive current sensor is a current transformer, a Hall Effect sensor or a fluxgate sensor.

11. A vessel comprising a marine electrical supply system according to claim 6.

* * * * *